(12) United States Patent
Miyagi

(10) Patent No.: US 6,882,203 B2
(45) Date of Patent: Apr. 19, 2005

(54) LATCH CIRCUIT FOR HOLDING DETECTION STATE OF A SIGNAL

(75) Inventor: Masanori Miyagi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/434,332

(22) Filed: May 8, 2003

(65) Prior Publication Data
US 2003/0214337 A1 Nov. 20, 2003

(30) Foreign Application Priority Data
May 14, 2002 (JP) ........................................ 2002-138505

(51) Int. Cl.[7] .............................................. H03K 3/037
(52) U.S. Cl. ...................................... 327/217; 327/142
(58) Field of Search ................................ 327/142, 143, 327/198, 217, 427, 434, 64; 257/369, 392

(56) References Cited

U.S. PATENT DOCUMENTS

| | | | | |
|---|---|---|---|---|
| 4,484,088 A | * | 11/1984 | Mazin et al. ................ 327/210 |
| 4,791,614 A | * | 12/1988 | Arakawa ..................... 365/228 |
| 5,774,402 A | * | 6/1998 | Lee ............................. 365/191 |
| 5,831,460 A | * | 11/1998 | Zhou .......................... 327/143 |
| 6,204,703 B1 | * | 3/2001 | Kwon ......................... 327/143 |

* cited by examiner

*Primary Examiner*—Linh My Nguyen
(74) *Attorney, Agent, or Firm*—Adams & Wilks

(57) ABSTRACT

A latch circuit is configured so that even if a power-on-reset circuit is not operated in putting a power supply to work, a depletion type MIS transistor is connected as a pull-down element to an output terminal of an RS latch to thereby reliably activate the RS latch in a reset state, whereby a circuit or a semiconductor integrated circuit device is prevented from being unintendedly operated. Furthermore, channel impurities of the depletion type MIS transistor are introduced into only a part, whereby it is possible to realize a semiconductor integrated circuit device which is excellent in safety and which is readily operated with less current consumption and with low cost.

5 Claims, 5 Drawing Sheets

LATCH CIRCUIT FOR HOLDING DETECTION STATE OF A SIGNAL

BACKGROUND OF THE INVENTION

1. Field of the Invention

The present invention relates to a latch circuit in which a depletion type (or depletion mode) MIS transistor is connected either to an output node or to an input node thereof so that even if neither a set signal nor a reset signal is input when a power supply is activated, an output signal is stably fixed either in a set state or in a reset state, and to a semiconductor integrated circuit device provided with the latch circuit.

2. Description of the Related Art

Heretofore, a latch circuit for holding the state of detection of a signal generally has, when an RS latch circuit is used, a circuit configuration as shown in FIG. 9. The conventional latch circuit will hereinbelow be described with reference to FIG. 9.

First of all, a signal detecting circuit 2 detects a specific instruction input to a semiconductor integrated circuit device or detects an abnormality of a voltage appearing at a specific terminal or a power supply voltage, or an abnormality of a temperature thereof. A detection output signal $S_{SETX}$ is connected to a set terminal SX of a holding circuit such as a flip-flop such as an RS latch 1 which is active at the level "L", and which is comprised of a 2-input NAND gate and a 3-input NAND gate. Upon detection of a specific instruction to a semiconductor integrated circuit device or detection of abnormality of a voltage or a temperature, the level of an output signal $S_{CE}$ of the 3-input NAND gate serving as an output signal of the RS latch 1 becomes "L". At the same time, signals $R_{RSTX1}$ and $S_{RSTX2}$ input to a reset input terminal of the RS latch 1 are at the level "H". An output signal of the RS latch is an enable signal of other circuits or systems. For example, upon recognition of a write instruction or a write enabling instruction to a nonvolatile memory device, the state of the circuit for generating a write start signal is placed in the enable state in accordance with the enable signal, or upon detection of short-circuit, abnormal heating or the like of a specific terminal, these circuits or systems are stopped in accordance with the enable signal.

When turning on the power supply, the RS latch 1 is reset in accordance with the signal $S_{SRSTX1}$ as the output signal of the power-on-reset circuit 3, whereby right after turning on the power supply, the state of a write start signal generating circuit for generating a write start signal to a nonvolatile memory device is placed in a disable state, or in the case where the latch circuit is configured so that a signal detecting circuit detects a short-circuit, abnormal heating or the like of a specific terminal, the state of a controlled circuit is surely placed in the operation state to prevent a circuit or a system for remaining in the stop state right after turning on the power supply.

However, in general, power-on-reset circuits can not reliably generate reset signals in some cases when turning on the power supply.

In such a case, there is encountered a problem in that when turning on the power supply, the data in the nonvolatile memory device is rewritten into unintended data by mistake, or a circuit for which the power supply must be essentially activated in the operation state is stopped right after turning on the power supply.

SUMMARY OF THE INVENTION

In light of the foregoing, the present invention has been made in order to solve the above-mentioned problems associated with the prior art, and it is, therefore, an object of the present invention to provide a latch circuit which is excellent in safety and reliability and by which even if a power supply voltage is activated in any way, unintended circuits are not operated, and a semiconductor integrated circuit device provided with the same.

In order to solve the above-mentioned problems, according to an aspect of the present invention, there is provided a latch circuit including: at least one data set input node; at least one data reset input node; and at least one data output node, in which a drain electrode of a depletion type MIS transistor is connected to one of the data output node, and a gate electrode and a source electrode of the depletion type MIS transistor are connected to have the same potential.

According to the present invention, even if no power-on-reset signal is inputted to the latch circuit when putting the power supply to work, the potential appearing at the output node is turned into the specific potential by the depletion type MIS transistor connected to the output node without fail. Thus, the latch circuit is prevented from being unintendedly operated.

In addition, according to another aspect of the present invention, there is provided a latch circuit including: at least one data set input node; at least one data reset input node; and at least one data output node, in which a drain electrode of a depletion type MIS transistor is connected to at least one of the data set input node and the data reset input node, and a gate electrode and a source electrode of the depletion type MIS transistor are connected to have the same potential.

According to the present invention, even if no power-on-reset signal is inputted to the latch circuit when putting the power supply to work, the latch circuit is turned into the specific direction by the depletion type MIS transistor connected to the set input node or the reset input node without fail. Thus, the latch circuit is prevented from being unintendedly operated.

In addition, according to another aspect of the present invention, there is provided a latch circuit in which an area of a region having channel impurities providing the depletion type introduced thereinto in a channel region of the depletion type MIS transistor is smaller than that of a physical channel region as an intersection portion between a gate electrode and an active region.

According to another aspect of the present invention, since the processing size limit of a region having depletion type impurities introduced thereinto is determined on the basis of the resolution of photo resist, the region can be made smaller than the processing size limit of an active region which is determined on the basis of the processing size accuracy in the etching. Hence, it is possible to form a MIS transistor having an equivalently smaller channel width, it is possible to shorten a channel length of the MIS transistor as compared with that of the conventional depletion type MIS transistor shown in FIG. 10 in the case of the same current driving ability, and it is possible to obtain the necessary characteristics with a smaller area. In FIG. 10, reference numeral 5 designates a source region, reference numeral 6 designates a drain region and reference numeral 7 designates a gate electrode. Furthermore, reference numeral 8 designates a region having depletion type channel impurities introduced thereinto in prior art.

In addition, according to another aspect of the present invention, there is provided a latch circuit in which an area of a region having channel impurities providing the depletion type introduced thereinto in a channel region of a depletion type MIS transistor is smaller than that of a physical channel region as an intersection portion between a gate electrode and an active region, and channel impurities providing the enhancement type are introduced into a part of a portion having no channel impurity providing the depletion type introduced thereinto.

In the latch circuit described above, the channel impurities providing the enhancement type are introduced into a part of the portion having no channel impurity providing the depletion type introduced thereinto in the channel region of the depletion type MIS transistor. Hence, since the leakage current is suppressed in the portion through which the current flow is to be avoided, it is possible to obtain the more accurate channel current characteristics to allow the malfunction or the like due to the leakage current to be prevented.

In addition, according to another aspect of the present invention, there is provided a semiconductor integrated circuit device including a latch circuit that has: at least one data set input node; at least one data reset input node; and at least one data output node, in which a drain electrode of a depletion type MIS transistor is connected to at least one of the data output nodes; a gate electrode and a source electrode of the depletion type MIS transistor are connected to have the same potential as the substrate potential of the depletion type MIS transistor; and an area of a region having channel impurities providing the depletion type introduced thereinto in the channel region of the depletion type MIS transistor is smaller than that of a physical channel region as an intersection portion between a gate electrode and an active region, and in the semiconductor integrated device, an output signal of a write instruction recognition circuit to a nonvolatile memory device is connected to the data set input terminal of the latch circuit, and a write start signal generating circuit for generating a write start signal to the nonvolatile memory device is connected to the data output node of the latch circuit.

In the semiconductor integrated circuit, when turning on the power supply or putting the power supply to work, the latch circuit is activated in the state of being reset without fail, which makes it possible to prevent the unintended data from being written to the nonvolatile memory device by mistake.

In addition, according to another aspect of the present invention, there is provided a semiconductor integrated circuit device including a latch circuit that has: at least one data set input node; at least one data reset input node; and at least one data output node, in which: a drain electrode of a depletion type MIS transistor is connected to any one of the data output nodes; a gate electrode and a source electrode of the depletion type MIS transistor are connected to have the same potential; and an area of a region having channel impurities providing the depletion type introduced thereinto in the channel region of the depletion type MIS transistor is smaller than that of a physical channel region as an intersection portion between a gate electrode and an active region, and in the semiconductor integrated circuit, an output signal of an instruction recognition circuit involved in a test mode is connected to the data set input terminal of the latch circuit, and a circuit that is operated during the test mode is connected to the data output node of the latch circuit.

In the semiconductor integrated device, since the latch circuit is activated in the state of being reset without fail, the latch circuit does not enter a test mode that is not released to general users by mistake, thereby preventing the latch circuit from operating unintendedly.

DETAILED DESCRIPTION OF THE PREFERRED EMBODIMENTS

First to eighth embodiments of a latch circuit according to the present invention will hereinafter be described in detail with reference to the accompanying drawings.

Figure 1:
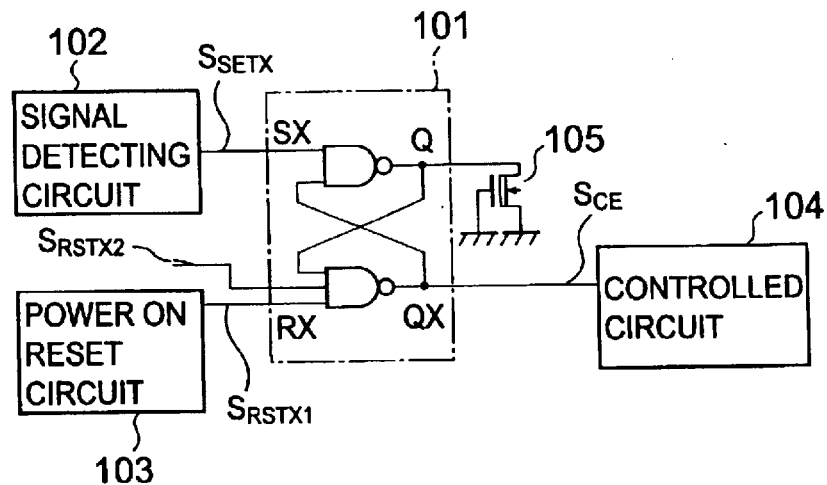
FIG. 1 is a block diagram, partly in circuit diagram, showing a configuration of a latch circuit according to a first embodiment of the present invention.

FIG. 1 is a block diagram, partly in circuit diagram, showing a configuration of a latch circuit according to a first embodiment of the present invention.

An RS latch 101 is constituted by one 2-input NAND and one 3-input NAND, and has one set input terminal and two reset input terminals.

A signal $S_{SETX}$ as an output signal of a signal detecting circuit 102 is inputted to the set input terminal, and the level of the signal $S_{SETX}$ goes "L" so that the RS latch 101 holds the detection state. The signal detecting circuit 101 detects a specific instruction, a voltage, a current and a temperature, for example, to change the output signal.

At the time when the RS latch 101 enters the detection state, the level of an output signal $S_{CE}$ goes "L" so that a controlled circuit 104 the operation of which is controlled in accordance with the output signal $S_{CE}$ is changed in operation.

Since a power-on-reset circuit 103 outputs a pulse signal at the level "L" only when turning the power supply ON, the latch circuit shown in FIG. 1 is placed in the reset state when putting the power supply ON.

Moreover, even in the case where the behavior of the activation of the power supply is unstable, and a power-on-clear reset circuit 203 does not output a reset signal, an output terminal Q of the RS latch 101 is pulled down by an N-channel depletion type MIS transistor 105. Hence, even in the unstable state in which neither a set signal nor a reset signal is inputted to the RS latch 101, the RS latch 101 can be turned into the reset side to be activated without fail.

In addition, an N-channel depletion type MIS transistor having a gate electrode connected to the same potential as that of a source electrode is utilized as a pull-down resistor. Hence, since the output terminal Q is usually pulled down with a fixed current value irrespective of the power supply voltage, even in the case where the RS latch 101 outputs a signal at the level "H", only a constant consumption current is caused to flow therethrough irrespective of the power supply voltage.

The output terminal Q is pulled down with such a small current as to turn the RS latch 101 into the reset side when turning on the power supply, whereby it is possible to build a safe circuit having less current consumption.

The same function can also be realized by connecting a P-channel depletion type MIS transistor having a gate electrode connected to the same potential as that of a source electrode, as a pull-up resistor, to an output terminal QX of the RS latch 101.

Figure 2:
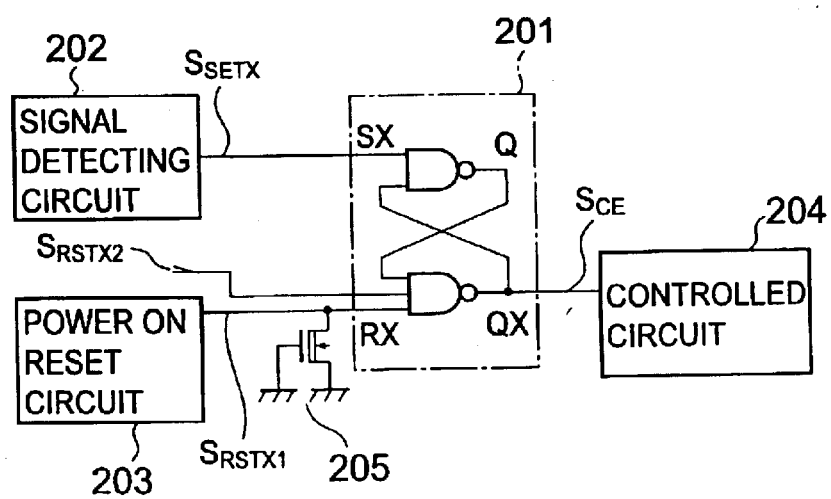
FIG. 2 is a block diagram, partly in circuit diagram, showing a configuration of a latch circuit according to a second embodiment of the present invention.

FIG. 2 is a block diagram, partly, in circuit diagram, showing a configuration of a latch circuit according to a second embodiment of the present invention.

The basic configuration and operation thereof are the same as those of the first embodiment. Moreover, even if in the case where the behavior of the activation of the power supply is unstable, or so forth and a power-on-clear circuit does not output a reset signal, a reset input terminal of an RS latch 201 is pulled down by an N-channel depletion type MIS transistor 205. Hence, even in the unstable state in which neither a set signal nor a reset signal is inputted to the RS latch 201, the RS latch 201 can be turned into the reset side to be activated without fail.

In addition, an N-channel depletion type MIS transistor having a gate electrode connected to the same potential as that of a source electrode is utilized as a pull-down resistor. Hence, since the reset input terminal is usually pulled down with a fixed current value irrespective of the power supply voltage, even in the stationary state in which a power-on-clear circuit outputs a signal at the level "H", only a constant consumption current is caused to flow therethrough irrespective of the power supply voltage.

The reset input terminal is pulled down with such a small current as to turn the RS latch 201 into the reset side when putting the power supply to work, whereby it is possible to build a safe circuit having less current consumption. In addition, an N-channel depletion type MIS transistor can also be connected to the other reset input $S_{RSTX2}$. The other reset input $S_{RSTX2}$ is the signal line adapted to reset the RS latch 201 not when putting the power supply to work, but as the normal circuit operation.

Figure 3:
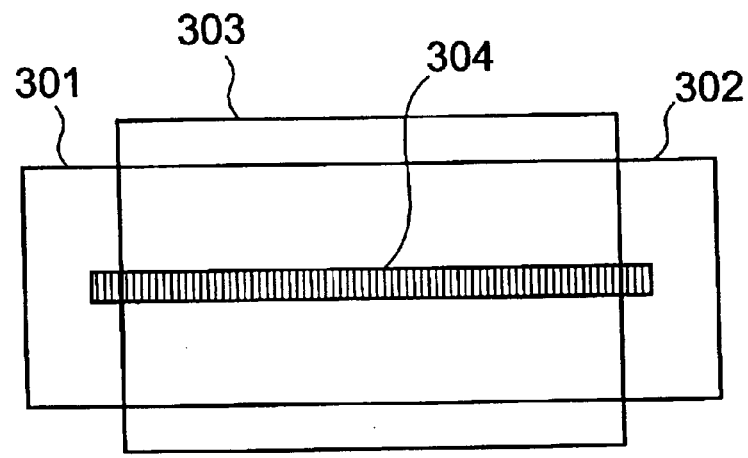
FIG. 3 is a schematic plan view showing a structure of a depletion type MIS transistor according to a third embodiment of the present invention.

FIG. 3 is a first example of a schematic plan view of a depletion type MIS transistor used in the latch circuits according to the first and second embodiments of the present invention. In the case where the MIS transistor shown in FIG. 3 is of an N-channel, for example, a gate electrode 303 is arranged on an active region formed of a thin oxide film on a P type substrate, and high N type impurities are introduced into a source region 301 and a drain region 302 to form a region 304 having channel impurities introduced thereinto and that gives a channel surface a depletion type in a part of a channel region.

At this time, the depletion type channel impurities are introduced with a narrower width than the physical channel width to allow a transistor having an equivalently smaller channel width to be formed. That is to say, even if the physical channel width is 10 $\mu$m, the region having the depletion type channel impurities introduced thereinto is formed in a slender slit shape with 1 $\mu$m width to allow a depletion type MIS transistor having an equivalent channel width of 1 $\mu$m to be obtained.

In general, the processing limit of the physical channel width is determined on the basis of the processing size in the etching, the Bird's Beak as the spreading of a field oxide film into an active region or the spreading of the impurities serving as the channel stopper for suppressing the inversion of a substrate under the field oxide film. Further, that processing limit is larger than that of the region having the channel impurities introduced thereinto determined only by the processing size accuracy of photo resist. Hence, in the case where a depletion type MIS transistor is utilized as a pull-down transistor or a pull-up transistor which requires the current to be concentratedly flown, for the purpose of obtaining the same current characteristics, when the channel width is determined on the basis of the region having the channel impurities introduced thereinto, the channel length can be made shorter, and hence the transistor size can be reduced.

It is possible to constitute the same form with a P-channel depletion type MIS transistor.

Figure 4:
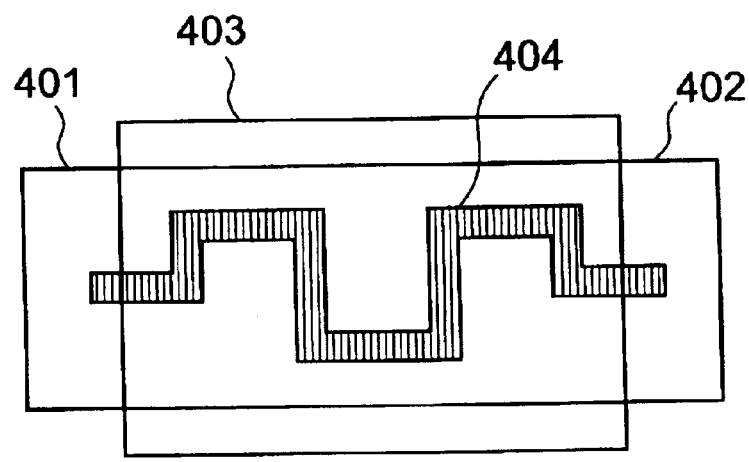
FIG. 4 is a schematic plan view showing a structure of a depletion type MIS transistor according to a fourth embodiment of the present invention.

FIG. 4 is a second example of a schematic plan view of a depletion type MIS transistor used in the latch circuits according to the first and second embodiments of the present invention. In the case where the MIS transistor shown in FIG. 4 is of an N-channel, for example, a gate electrode 403 is arranged on an active region formed of a thin oxide film on a P type substrate, and high N type impurities are introduced into a source region 401 and a drain region 402 to form a region 404 having channel impurities introduced thereinto and that gives a channel surface a depletion type in a part of a channel region.

Unlike the example shown in the third embodiment, the region 404 having the depletion type channel impurities introduced thereinto is formed so as to meander. Consequently, it is possible to obtain the transistor characteristics having an equivalently longer channel length than that of the third embodiment even though the physical channel length thereof is the same as that of the third embodiment.

As a result, it is possible to obtain the same characteristics as those of the third embodiment with a smaller area than that of the third embodiment.

Figure 5:
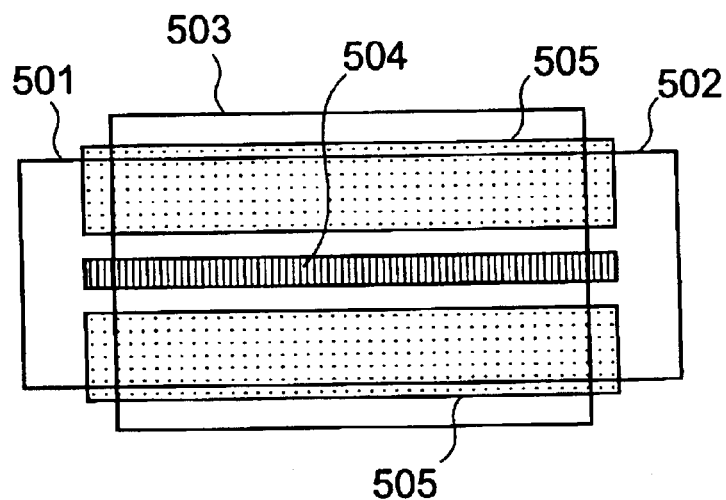
FIG. 5 is a schematic plan view showing a structure of a depletion type MIS transistor according to a fifth embodiment of the present invention.

FIG. 5 is a third example of a schematic plan view of a depletion type MIS transistor used in the latch circuits according to the first and second embodiments of the present invention. In the case where the MIS transistor shown in FIG. 5 is of an N-channel, for example, a gate electrode 503 is arranged on an active region formed of a thin oxide film on a P type substrate, and high N type impurities are introduced into a source region 501 and a drain region 502 to form a region 504 having channel impurities introduced thereinto and that gives a channel surface a depletion type in a part of a channel region.

In addition to the structure of the third embodiment, enhancement type channel impurity regions 505 are formed in a part of the region having no depletion type channel impurities introduced thereinto.

In general, in the case of an N-channel MIS transistor, if no channel impurity is introduced thereinto at all, then the inversion voltage of the region concerned (initial region)

becomes near 0V. Thus, even if the gate voltage is 0V, there is a possibility that at the high temperature or the like, a leakage current may be caused to flow through the portion between a source electrode and a drain electrode.

Enhancement type channel impurities are introduced into the initial region of the third embodiment to increase the inversion voltage, which results in that a leakage current can be suppressed to obtain a more accurate pull-down current, and hence it is possible to prevent the malfunction of the latch circuit due to an excessive leakage current.

Figure 6:
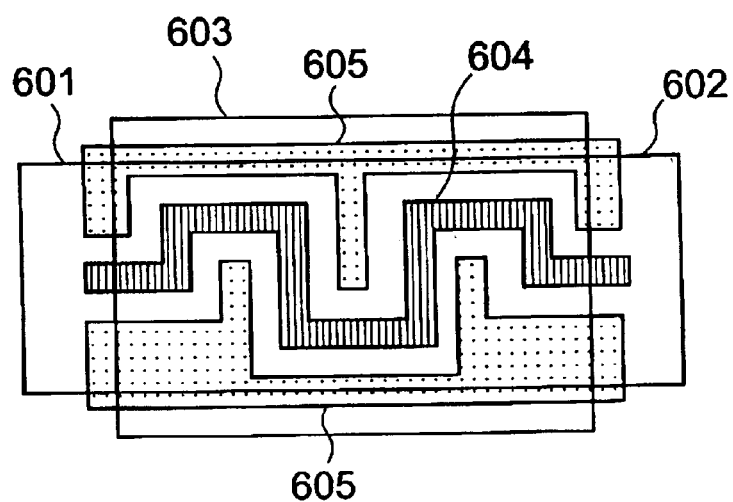
FIG. 6 is a schematic plan view showing a structure of a depletion type MIS transistor according to a sixth embodiment of the present invention.

FIG. 6 is a fourth example of a schematic plan view of a depletion type MIS transistor used in the latch circuits according to the first and second embodiments of the present invention. In the case where the MIS transistor shown min FIG. 6 is of an N-channel for example, a gate electrode 603 is arranged on an active region formed of a thin oxide film on a P type substrate, and high N type impurities are introduced into a source region 601 and a drain region 602 to form a region 604 having channel impurities introduced thereinto and that gives a channel surface a depletion type in a part of a channel region.

Unlike the example shown in the fifth embodiment, the region 604 having the depletion type channel impurities introduced thereinto is formed so as to meander, and similarly, a region 605 having the enhancement type channel impurities introduced thereinto is also formed so as to meander. Consequently, it is possible to obtain the transistor characteristics having an equivalently longer channel length than that of the fifth embodiment even though the physical channel length thereof is the same as that of the fifth embodiment.

As a result, it is possible to obtain the same characteristics as those of the fifth embodiment with a smaller area than that of the fifth embodiment.

Figure 7:
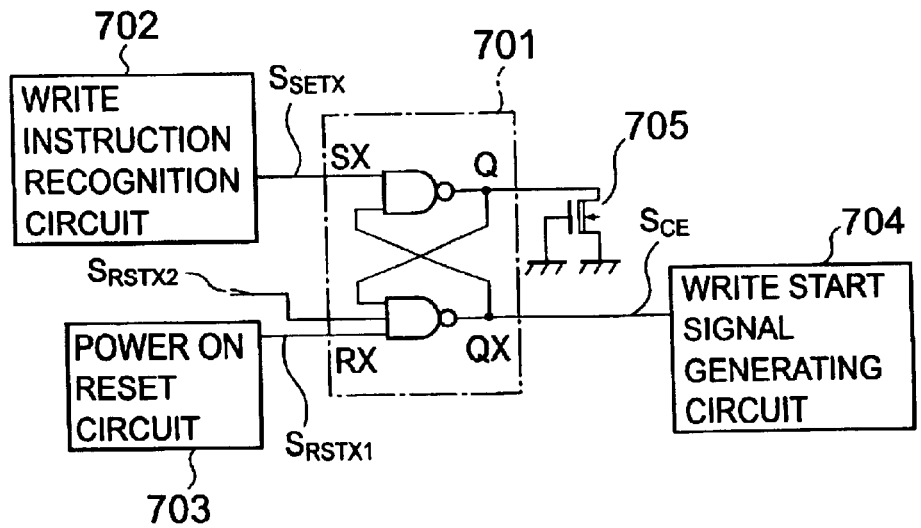
FIG. 7 is a block diagram, partly in circuit diagram, showing a configuration of a semiconductor integrated circuit device loaded with a latch circuit according to a seventh embodiment of the present invention.

FIG. 7 is a block diagram, partly in circuit diagram, showing a configuration of a latch circuit portion with which a semiconductor integrated circuit device is loaded according to a seventh embodiment of the present invention.

An output terminal Q of the RS latch 701 is pull-down-processed in an N-channel depletion type MIS transistor 705, and a region having channel impurities introduced thereinto as described in the third to sixth embodiments is formed in a channel region of the N-channel depletion type MIS transistor 705.

A write instruction recognition circuit 702 for detecting a write instruction or a write enable instruction to a nonvolatile memory device is connected to a set input terminal of the RS latch 701. Upon reception of an instruction code of write or write enable from a microcontroller or the like by a semiconductor integrated circuit device, the write instruction recognition circuit 702 outputs a signal at the level "L" to set the RS latch 701 to thereby allow the state of a write start signal generating circuit 704 to be placed in the enable state.

With the present configuration, even when a power-on-reset circuit 703 does not output the reset output signal due to the unsuitable activation of a power supply or the like when putting the power supply to work, since the output terminal Q of the RS latch 701 is pulled down by the N-channel depletion type MIS transistor 705, the RS latch 701 is put in the reset state right after activation of the power supply without fail. Thus, it is possible to prevent unintended data from being written into the nonvolatile memory device by mistake.

In addition, since it is possible to readily cause the pull-down current of the N-channel depletion type MIS transistor 705 to flow concentratedly, a semiconductor integrated circuit device loaded with a nonvolatile memory device which has less current consumption and which has the high safety can be realized with low cost.

Figure 8:
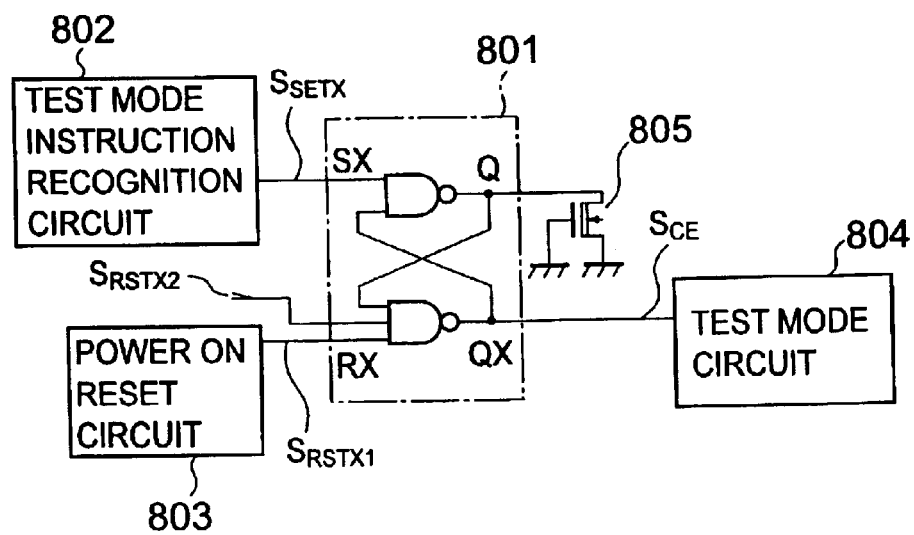
FIG. 8 is a block diagram, partly in circuit diagram, showing a configuration of a semiconductor integrated circuit device loaded with a latch circuit according to an eighth embodiment of the present invention.
Figure 9:
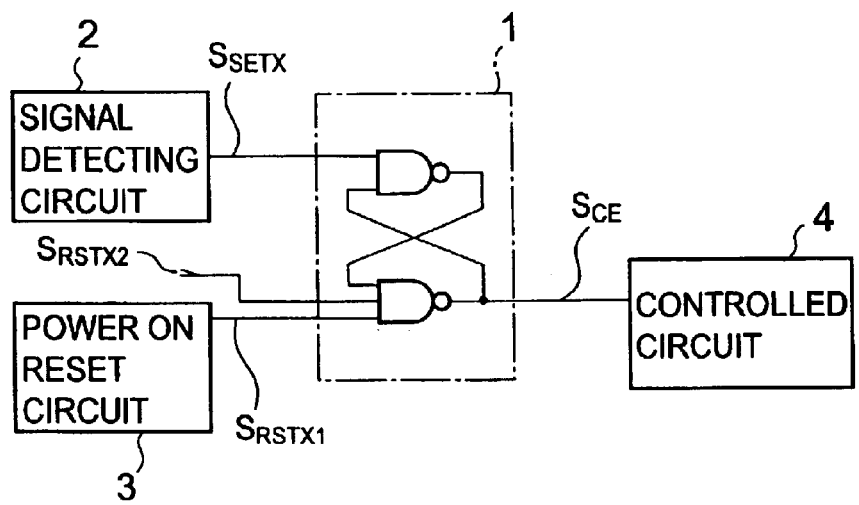
FIG. 9 is a block diagram, partly in circuit diagram, showing a configuration of a conventional latch circuit.
Figure 10:
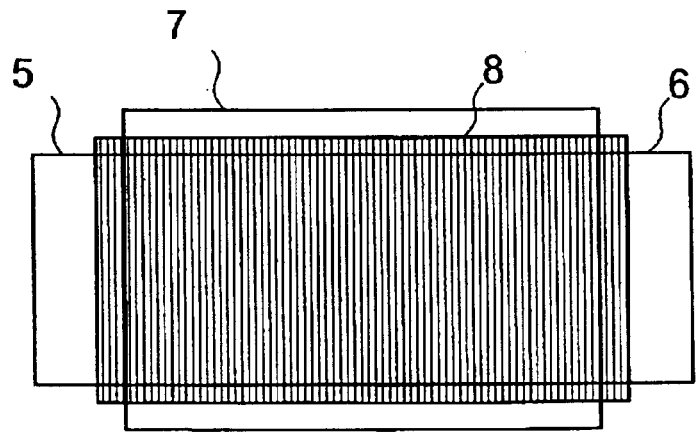
FIG. 10 is a schematic plan view showing a structure of a conventional depletion type MIS transistor.

FIG. 8 is a block diagram, partly in circuit diagram, showing a configuration of a latch circuit portion with which a semiconductor integrated circuit device is loaded according to an eighth embodiment of the present invention.

An output terminal Q of a RS latch 801 is pull-down-processed in an N-channel depletion type MIS transistor 805, and a region having channel impurities introduced thereinto as described in the third to sixth embodiments is formed in a channel region of the N-channel depletion type MIS transistor 805.

A test mode instruction recognition circuit 802 is connected to a set input terminal of the RS latch 801. The test mode instruction recognition circuit 802 recognizes an instruction only when the semiconductor integrated circuit device is tested, and normally, does not recognize a test mode instruction unless an instruction is issued in accordance with a special procedure.

Upon recognition of the test mode instruction by the test mode instruction recognition circuit 802, the RS latch 801 becomes the set state, and a test mode circuit 804 becomes the enable state.

With the present configuration, even when a power-on-reset circuit 803 does not output any reset output signal due to the unsuitable activation of a power supply or the like when putting the power supply to work, since the output terminal Q of the RS latch 801 is pulled down by the N-channel depletion type MIS transistor 805, the RS latch 801 becomes the reset state right after activation of the power supply without fail. Thus, it is possible to prevent the test mode circuit from becoming the enable state by mistake-so that the semiconductor integrated circuit device is prevented from being unintendedly operated.

In addition, since it is possible to readily cause the pull-down current of the N-channel depletion type MIS transistor 805 to flow concentratedly, a semiconductor integrated circuit device which has less current consumption and which has high safety can be realized with low cost.

As set forth hereinabove, according to the present invention, it is possible to obtain a latch circuit which is excellent in safety and reliability and by which since the latch circuit can be surely reset right after putting a power supply to work, no matter how a power supply voltage is activated, none of the unintended circuits are operated, and a semiconductor integrated circuit device loaded with the same.

While the present invention has been particularly shown and described with reference to the preferred embodiments, it will be understood that the various changes and modifications will occur to those skilled in the art without departing from the scope and true spirit of the invention. The scope of the invention is, therefore, to be determined solely by the appended claims.

What is claimed is:

1. A latch circuit comprising: a set input node; a reset input node; an output node; a holding circuit connected to the set input node, the reset input node and the output node; and a depletion mode MIS transistor having a gate electrode, a source electrode connected to the gate electrode, a drain electrode connected to the output node, a source region, a drain region, a channel region extending between the source and drain regions, and a depletion region formed in a portion of the channel region in contact with the source and drain regions, the depletion region comprising an impurity region extending across the channel region in a straight line between the source and drain regions and having smaller width than that of the channel region.

2. A latch circuit comprising: a set input node; a reset input node; an output node; a holding circuit connected to the set input node, the reset input node and the output node; and a depletion mode MIS transistor having a gate electrode, a source electrode connected to the gate electrode, a drain electrode connected to the output node, a source region, a drain region, a channel region extending between the source and drain regions, and a depletion region formed in a portion of the channel region in contact with the source and drain regions, the depletion region comprising an impurity region extending across the channel region in a meandering line between the source and drain regions.

3. A latch circuit comprising: a detecting circuit for detecting a given condition; a flip-flop having a set input terminal connected to an output of the detecting circuit and being set to a given state when the output of the detecting circuit has a given value; a power on reset circuit for releasing the given state when a power supply is turned on; and a depletion mode MIS transistor having a gate electrode, a source electrode connected to the gate electrode, a drain electrode connected to the output node, a source region, a drain region, a channel region extending between the source and drain regions, and a depletion region formed in a portion of the channel region in contact with the source and drain regions, the depletion region comprising an impurity region extending across the channel region in a straight line between the source and drain regions and having smaller width than that of the channel region.

4. A latch circuit comprising: a detecting circuit for detecting a given condition; a flip-flop having a set input terminal connected to an output of the detecting circuit and being set to a given state when the output of the detecting circuit has a given value; a power on reset circuit for releasing the given state when a power supply is turned on; and a depletion mode MIS transistor having a gate electrode, a source electrode connected to the gate electrode, a drain electrode connected to the output node, a source region, a drain region, a channel region extending between the source and drain regions, and a depletion region formed in a portion of the channel region in contact with the source and drain regions, the depletion region comprising an impurity region extending across the channel region in a meandering line between the source and drain regions.

5. A latch circuit comprising: a detecting circuit for detecting a temperature and indicating whether the detected temperature is above or lower than a specific value; a set input node connected to an output of the detecting circuit; a reset input node; an output node; a holding circuit comprising a flip-flop circuit having a set input terminal connected to the set input node, a reset input terminal connected to the reset input node, and an output terminal connected the output node; and a depletion mode MIS transistor having a gate electrode, a source electrode connected to the gate electrode, a drain electrode connected to the output node.

* * * * *